US012777954B2

(12) United States Patent
Kummerl et al.

(10) Patent No.: US 12,777,954 B2
(45) Date of Patent: Oct. 27, 2026

(54) SHAPE MEMORY POLYMER FOR USE IN SEMICONDUCTOR DEVICE FABRICATION

(71) Applicant: Texas Instruments Incorporated, Dallas, TX (US)

(72) Inventors: Steven Alfred Kummerl, Carrollton, TX (US); Benjamin Stassen Cook, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/059,473

(22) Filed: Nov. 29, 2022

(65) Prior Publication Data

US 2023/0093214 A1 Mar. 23, 2023

Related U.S. Application Data

(62) Division of application No. 17/220,782, filed on Apr. 1, 2021.

(60) Provisional application No. 63/004,281, filed on Apr. 2, 2020.

(51) Int. Cl.

*H01L 21/48* (2006.01)
*H10W 70/05* (2026.01)
*H10W 70/65* (2026.01)
*H10W 70/67* (2026.01)
*H10W 70/695* (2026.01)
*H10P 54/00* (2026.01)

(52) U.S. Cl.

CPC ....... *H10W 70/695* (2026.01); *H10W 70/093* (2026.01); *H10W 70/65* (2026.01); *H10W 70/688* (2026.01); *H10P 54/00* (2026.01)

(58) Field of Classification Search

CPC ... H01L 23/145; H01L 21/4853; H01L 21/78; H01L 23/49838; H01L 23/4985; H01L 21/4846; H01L 23/13; H01L 23/5387
USPC .......................................................... 257/668
See application file for complete search history.

(56) References Cited

U.S. PATENT DOCUMENTS 5,615,088 A * 3/1997 Mizumo .............. H05K 3/4697 361/776
6,696,748 B1 * 2/2004 Thurgood ............. H01L 21/563 257/668
6,743,982 B2 * 6/2004 Biegelsen ........... H01L 25/0655 257/E23.177
7,214,567 B2 * 5/2007 Yamagata ............... H01L 24/27 438/106
7,368,307 B2 * 5/2008 Cok ................... H10K 50/8428 257/E33.059
7,573,125 B2 * 8/2009 Thurgood ........... H01L 23/3121 257/E23.001
7,727,450 B1 6/2010 Berger et al.
7,923,793 B2 * 4/2011 Choi ...................... H04N 25/00 257/415
8,071,882 B2 * 12/2011 Okajima ................ H05K 1/028 174/250
8,119,924 B2 * 2/2012 Abe .................. H01L 23/49822 174/250
8,332,053 B1 * 12/2012 Patterson ............. H05K 1/0283 607/152

(Continued)

*Primary Examiner* — Vu A Vu

(74) *Attorney, Agent, or Firm* — Zhenhai Fu; Charles F. Koch

(57) ABSTRACT

An integrated circuit comprises a substrate including a shape memory polymer, and a semiconductor die mounted on the substrate.

20 Claims, 11 Drawing Sheets

(56) References Cited

U.S. PATENT DOCUMENTS

| | | | | |
|---|---|---|---|---|
| 8,484,836 | B2 * | 7/2013 | Lanzara | H05K 1/0283 174/253 |
| 8,552,540 | B2 * | 10/2013 | Warren | H01L 23/49827 257/E23.06 |
| 8,810,113 | B2 * | 8/2014 | Han | H01L 41/313 29/25.35 |
| 9,041,180 | B2 * | 5/2015 | Lee | H01L 25/105 438/109 |
| 9,349,684 | B2 * | 5/2016 | Kim | H05K 1/0281 |
| 9,391,286 | B1 * | 7/2016 | Kwon | H01L 25/0753 |
| 9,611,358 | B2 * | 4/2017 | Jeong | H01L 51/56 |
| 9,799,708 | B2 * | 10/2017 | Hong | H10K 77/111 |
| 9,954,139 | B2 | 4/2018 | Krause et al. | |
| 9,972,568 | B2 * | 5/2018 | Kim | H01L 24/81 |
| 10,026,721 | B2 * | 7/2018 | Kim | H05K 1/0283 |
| 10,056,435 | B2 * | 8/2018 | Hong | H10K 77/111 |
| 10,310,560 | B2 * | 6/2019 | Choi | H05B 33/14 |
| 10,651,265 | B2 * | 5/2020 | Park | H10K 77/10 |
| 10,943,893 | B2 * | 3/2021 | Jung | H10K 59/131 |
| 10,943,938 | B2 * | 3/2021 | Chiang | H10F 39/804 |
| 10,964,769 | B2 * | 3/2021 | Park | H10K 59/124 |
| 10,984,755 | B2 * | 4/2021 | Chida | G09F 9/302 |
| 10,991,621 | B2 * | 4/2021 | Esteron | H10P 54/00 |
| 10,991,738 | B2 * | 4/2021 | Chambion | H10F 39/806 |
| 11,024,652 | B2 * | 6/2021 | Nam | H01L 21/32056 |
| 11,315,846 | B2 * | 4/2022 | Myodo | H01L 24/73 |
| 11,469,285 | B2 * | 10/2022 | Zhang | H10K 59/8731 |
| 11,763,712 | B2 * | 9/2023 | Wang | G06F 1/1652 345/55 |
| 11,769,785 | B2 * | 9/2023 | Chambion | H10F 39/199 438/106 |
| 11,908,832 | B2 * | 2/2024 | Rochas | H10F 71/139 |
| 12,177,981 | B2 * | 12/2024 | Sano | H05K 1/181 |
| 2004/0036153 | A1 * | 2/2004 | Thurgood | H01L 23/3128 257/668 |
| 2006/0046433 | A1 * | 3/2006 | Sterrett | H01L 21/6836 438/459 |
| 2008/0242052 | A1 * | 10/2008 | Feng | H01L 21/3043 438/459 |
| 2009/0168374 | A1 * | 7/2009 | Clayton | H05K 1/189 361/749 |
| 2011/0068504 | A1 * | 3/2011 | Tobise | B29C 59/022 264/293 |
| 2015/0342050 | A1 | 11/2015 | Jiang et al. | |
| 2018/0144982 | A1 | 5/2018 | Muri et al. | |
| 2021/0057311 | A1 * | 2/2021 | Ballinger | H01L 24/95 |

* cited by examiner

SHAPE MEMORY POLYMER FOR USE IN SEMICONDUCTOR DEVICE FABRICATION

CROSS-REFERENCE TO RELATED APPLICATION

This application is a divisional of prior application Ser. No. 17/220,782, filed Apr. 1, 2021, currently pending, which claims priority to U.S. Provisional Application No. 63/004,281, filed Apr. 2, 2020, all of which are hereby incorporated by reference.

BACKGROUND

A semiconductor die typically includes an integrated circuit formed thereon. The die then may be attached to a substrate and packaged with mold compound to form a completed semiconductor device ("chip"). Multiple (e.g., tens, hundreds, thousands) of dies are formed on a semiconductor wafer. Typically, the individual dies are singulated from the wafer and, through a pick-and-place process, each individual die is picked and placed on a corresponding substrate. The pick-and-place process is time-consuming.

SUMMARY

A method for forming a semiconductor structure includes curing a shape memory polymer in a first shape. The shape memory polymer is coupled to a conductive layer. The method further includes folding the shape memory polymer from the first shape into a second shape. The method also includes bonding a semiconductor wafer to the conductive layer while the shape memory polymer is in the second shape. The semiconductor wafer has first and second dies. The semiconductor wafer is then singulated to separate the first die from the second die. The method further includes expanding the shape memory polymer to its first shape and singulating the shape memory polymer to separate the first and second dies.

DETAILED DESCRIPTION

The examples described herein are directed to the use of a shape memory polymer that is part of a substrate to be bonded to a semiconductor wafer having multiple semiconductor dies. The wafer is bonded to the substrate before the wafer is singulated into its individual dies. The shape memory polymer causes the substrate to have a first shape (e.g., flat) during a curing process. The substrate is then folded into a second shape such that the dies on the wafer can be bonded to corresponding die receiving portions of the substrate. The substrate's die receiving portions are closer together when the substrate is in its folded, second shape than when the substrate is in its first shape. After the wafer is bonded to the folded substrate, the wafer is singulated and the substrate is then heated to cause the substrate, and the singulated dies bonded thereto, to unfold back into its first shape. The substrate can then be singulated to separate out the individual dies and corresponding portions of the substrate. Wafer-level bonding the substrate to the wafer and then separating the individual dies is faster than a pick-and-place process in which the wafer is first singulated and then individual dies are picked and placed on a substrate. Further, the distance between receiving portions on the substrate is not required to match the distance between the dies on the wafer when the substrate is in its first (flat) shape. The folding of the substrate effectively reduces the distance between the die receiving portions on the substrate so as to match the die pattern on the wafer.

Figure 1:
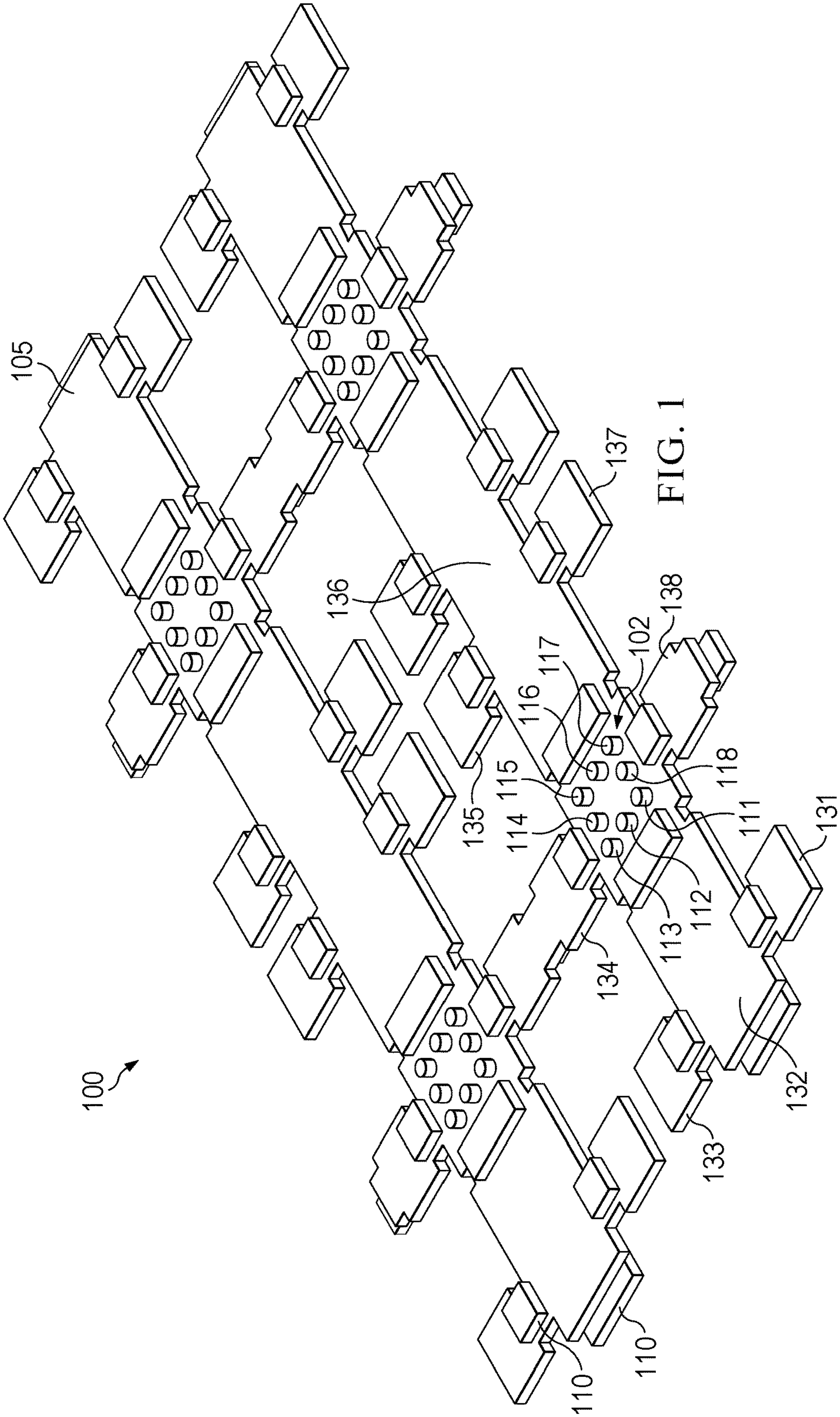
FIGS. 1 and 2 illustrate an example of a substrate having a shape memory polymer and configured into a first shape.
Figure 2:
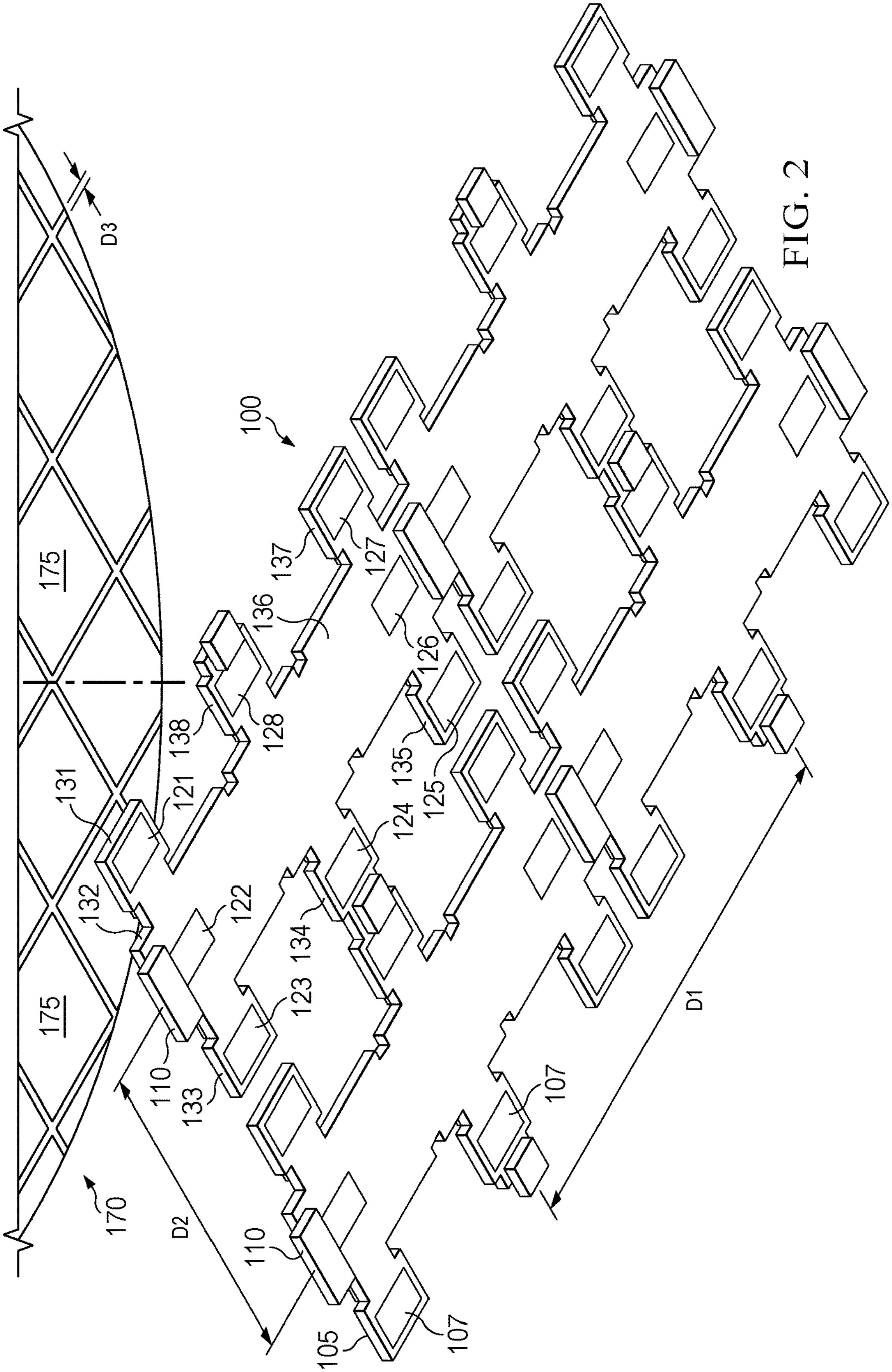

FIGS. 1 and 2 show an example of at least a portion of a substrate 100 that includes a shape memory polymer 110. FIGS. 1 and 2 are views of the substrate 100 from opposite sides. The substrate 100 includes multiple materials such as a layer of polyimide 105, a conductive layer (e.g., copper) 107 (shown in FIG. 2), and one or more layers of a shape memory polymer 110. Examples of polyimide 105 include thermosetting and thermoplastic. The shape memory polymer 110 is a polymeric material that has the ability to acquire a permanent shape upon mechanically forcing the material into the desired permanent shape and then curing the material while in that shape. In one example, the curing process may include the application of an ionizing radiation, such as ionizing radiation that is useful in food and medical product sterilization. Depending on the polymer, the amount (dose) can be varied to impart the desired level of crystallization. The material will then retain that shape. The shape memory polymer material can then be deformed and then returned from the deformed state (temporary shape) to its original (permanent) shape upon application of an external stimulus, such as temperature change, application of an electric field, or application of a magnetic field. Examples of shape memory polymer 110 include a thermoplastic or thermoset material such at least one of PET (polyethylene terephthalate), polyurethanes, polyimides, polybenzoxazoles (PBO), polytetrafluoroethylene (PFTE), polylactide (PLA), or ethylene-vinyl acetate (EVA).

The substrate 100 includes multiple die receiving portions 102. Each die receiving portion 102 includes one or more conductive contacts to which corresponding pins of a semiconductor die can be attached (e.g., soldered). In the example of FIGS. 1 and 2, that portion of the substrate 100 shown includes four die receiving portions 102, each of which is adapted to receive a separate die as explained below. FIG. 1 illustrates each of the die receiving portions includes eight conductive contacts, labeled in one of the die receiving portions as contacts 111-118. A die to be attached to that die receiving portion includes eight corresponding pins. In this example, each die receiving portion 102 includes the same number of contacts, the same pattern of contacts, and the same spacing (pitch) between adjacent contacts. As explained below, the substrate 100 is attached to a wafer containing multiple dies. In one example, the wafer may have dozens, hundreds, thousands, or tens of thousands of dies, and the substrate 100 has the corresponding number of die receiving portions 102.

The contacts 111-118 of each die receiving portion 102 on the substrate 100 fan out to pads 121-128 (FIG. 2) through the conductive layer 107. Contact 111 is coupled to pad 121. Contact 112 is coupled to pad 122. Contact 113 is coupled to pad 123. Contact 114 is coupled to pad 124. Contact 115 is coupled to pad 125. Contact 116 is coupled to pad 126. Contact 117 is coupled to pad 127. Contact 118 is coupled to pad 128. By attaching (e.g., soldering) pads 121-128 to a printed circuit board (PCB), electrical connection is thereby established between the PCB and the die's pins.

Each die receiving portion 102 in this example includes a central area to which a die is coupled and peripheral portions containing the contact pads 121-128. FIG. 2 shows that contact pad 121 is on peripheral portion 131. Similarly, contact pad 122 is on peripheral portion 132. Contact pad 123 is on peripheral portion 133. Contact pad 124 is on peripheral portion 134. Contact pad 125 is on peripheral portion 135. Contact pad 126 is on peripheral portion 136. Contact pad 127 is on peripheral portion 137. Contact pad 128 is on peripheral portion 138.

In one embodiment, the shape memory polymer 110 includes a shape memory polymer layer on opposites surfaces of the combination of the polyimide 105 and conductive layer 107, and some areas of the shape memory polymer 110 may be removed to expose contact pads 121-128 of the conductive layer 107 which may eventually be soldered to, for example, a PCB. For ease of viewability, only some of the shape memory polymer 110 is shown in FIGS. 1 and 2. The portions shown of the shape memory polymer 110 represent fold lines, described below, along which the substrate 100 will be folded before the substrate 100 is attached to the wafer.

FIG. 2 illustrates a wafer 170 including multiple dies 175 before the wafer 170 is attached to the substrate 100. The distance between the adjacent receiving portions 102 in one axis is D1, and the distance between adjacent receiving portions 102 in the orthogonal axis is D2. The spacing between adjacent dies 175 on wafer 170, however, is D3, and D3 is substantially smaller than either D1 or D2. Accordingly, the wafer 170 is fabricated with the dies 175 being in closer proximity to one another than is the spacing between the die receiving portions 102 on the substrate 100 when the substrate is a flat shape as shown in FIGS. 1 and 2.

As explained above, the substrate 100 includes a shape memory polymer 110. The substrate 100 is put into a flat shape as shown in FIGS. 1 and 2 and cured while in that shape. The curing process may be as explained above. As a result of the curing process, the shape memory polymer 110 retains this flat shape as its permanent shape.

The substrate 100 is then folded along the fold lines delineated by the locations of the shape memory polymer 110 in FIGS. 1 and 2. The following explanation of the folding of the substrate 100 is with respect to the peripheral portions 131-138 of the receiving portion 102 as numbered in FIGS. 1 and 2, but the other receiving portions on the substrate 100 are configured the same and thus the folds are the same with respect to all such receiving portions.

All angles referenced herein are approximate angles even if the adjective "approximately" is not specifically used. For example, a reference to a 90-degree angle means approximately 90 degrees. In one example, "approximately" means plus or minus 10%. Accordingly, an angle of approximately 90 degrees means 90 degrees+/−10% (90 degrees+/−0.9 degrees). The term "flat" means a structure that has a planar surface or a surface that is not bowed or bent more than 10%.

Figure 3:
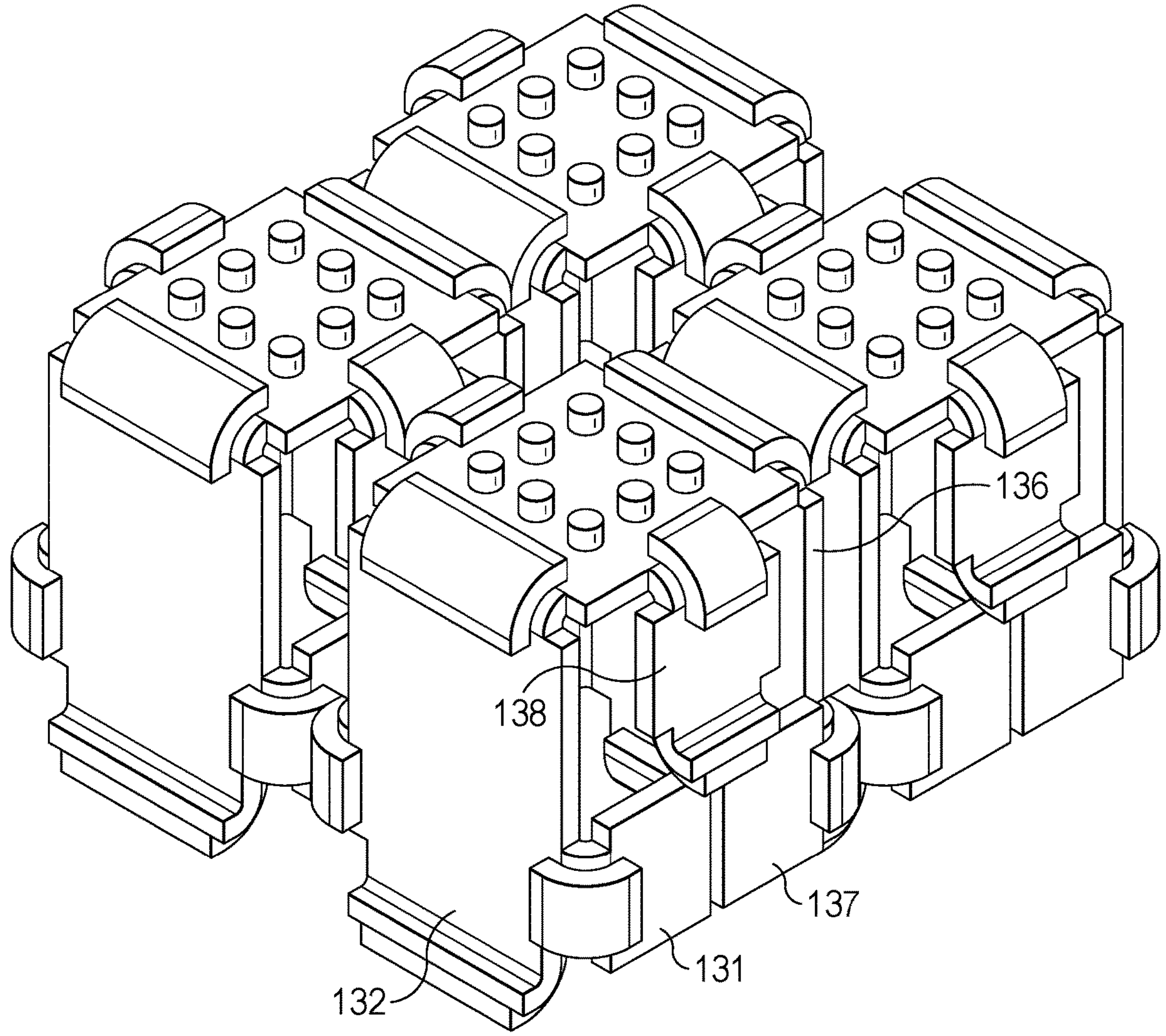
FIGS. 3-6 illustrate the substrate folded into a second shape for bonding to a semiconductor wafer in accordance with an example.
Figure 4:
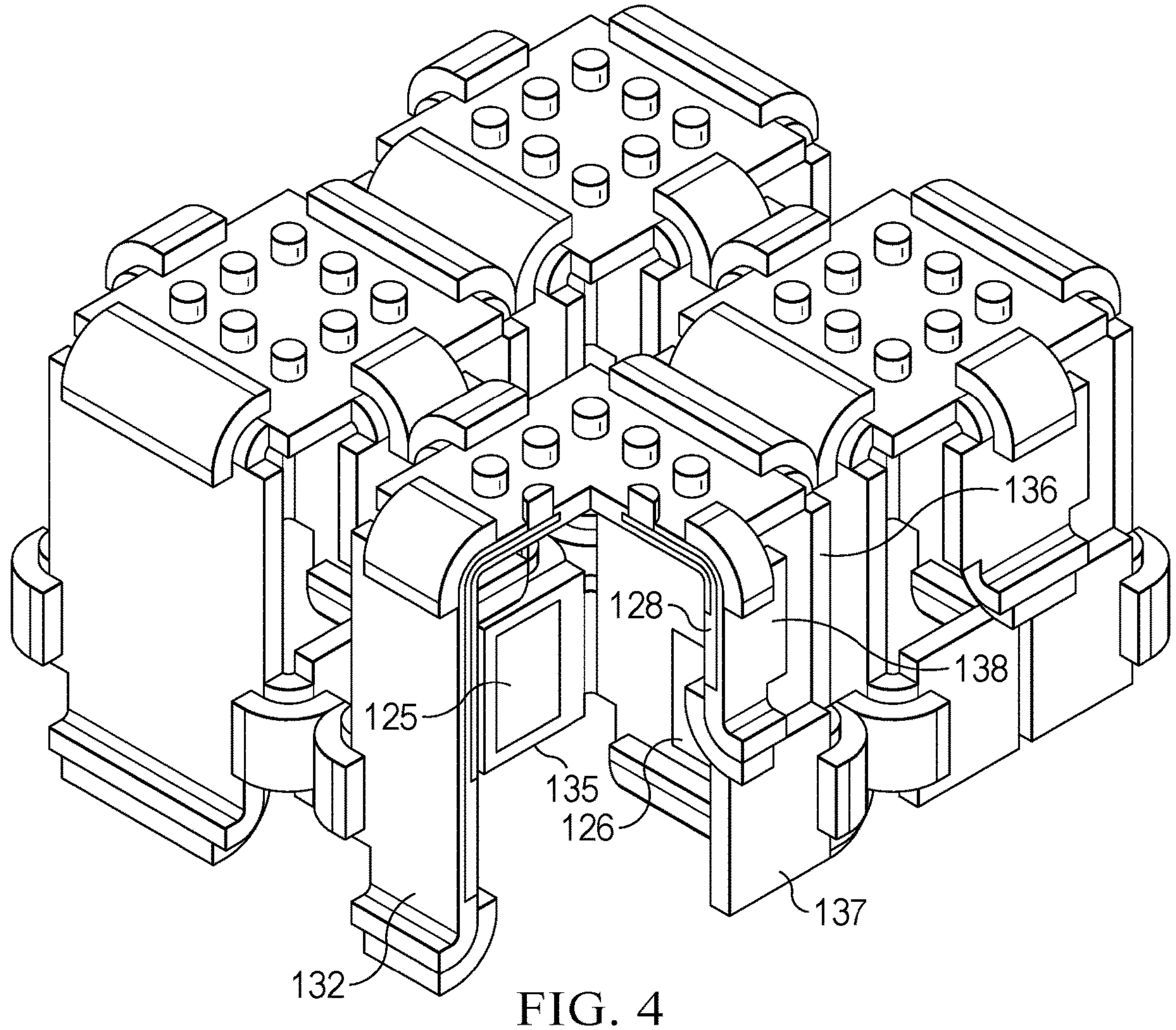
Figure 5:
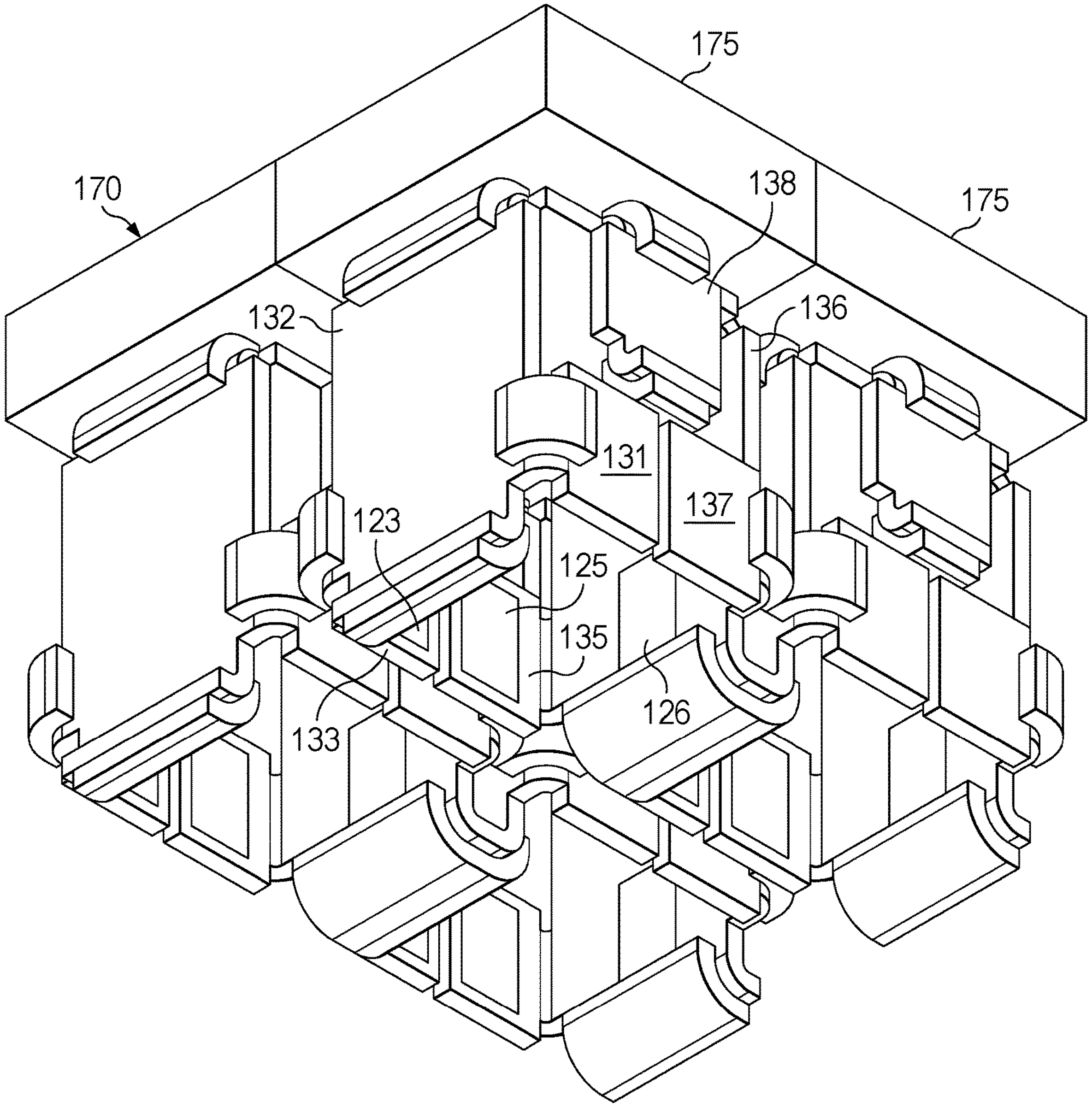
Figure 6:
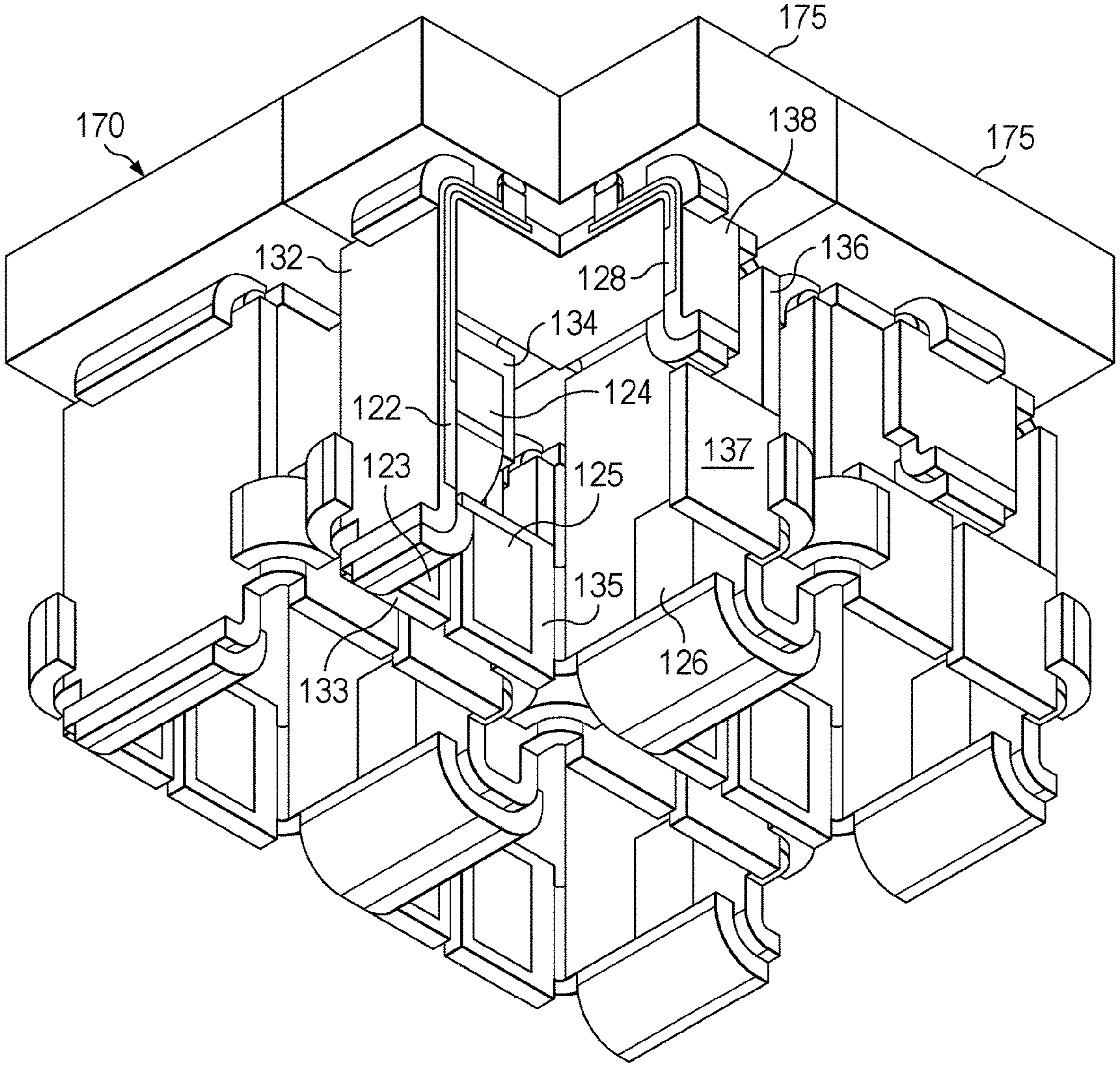

FIGS. 3-6 illustrate an example of the substrate 100 in a folded shape. An example technique for folding the substrate is described below. FIG. 3 shows a top perspective view of the substrate. FIG. 4 shows the same view but with a front corner removed to better show components that are otherwise hidden. FIGS. 5 and 6 show views of the folded structure but from the bottom. FIGS. 5 and 6 also show semiconductor wafer 170 with dies 175 attached to their respective die receiving portions 102 of the substrate 100. The parenthetical figure references below are the figures that may best show a certain component.

Referring collectively to FIGS. 3-6, peripheral portions 132, 134 (FIG. 6), 136, and 138 are shown folded downward from the plane defining the receiving portion 102 which will receive the die. The peripheral portions 132, 134, 136, and 138 are angled downward 90 degrees. Further, the peripheral portions 131, 133 (FIGS. 5 and 6), 135 (FIGS. 4-6), and 137 are folded inward by 90 degrees relative to the planes of their respective peripheral portions 132, 134, 136, and 138 as shown.

With the substrate folded along the fold lines as shown in FIGS. 3-6, adjacent die receiving portions 102 of the substrate are drawn closer together resulting in the distance between the adjacent die receiving portions matching the distance between the respective dies 175 on the wafer 170—that is, matching closely enough to accommodate the wafer 170 to be bonded to the substrate 100 and the dies 175 to bond to their respective die receiving portions.

Figure 7:
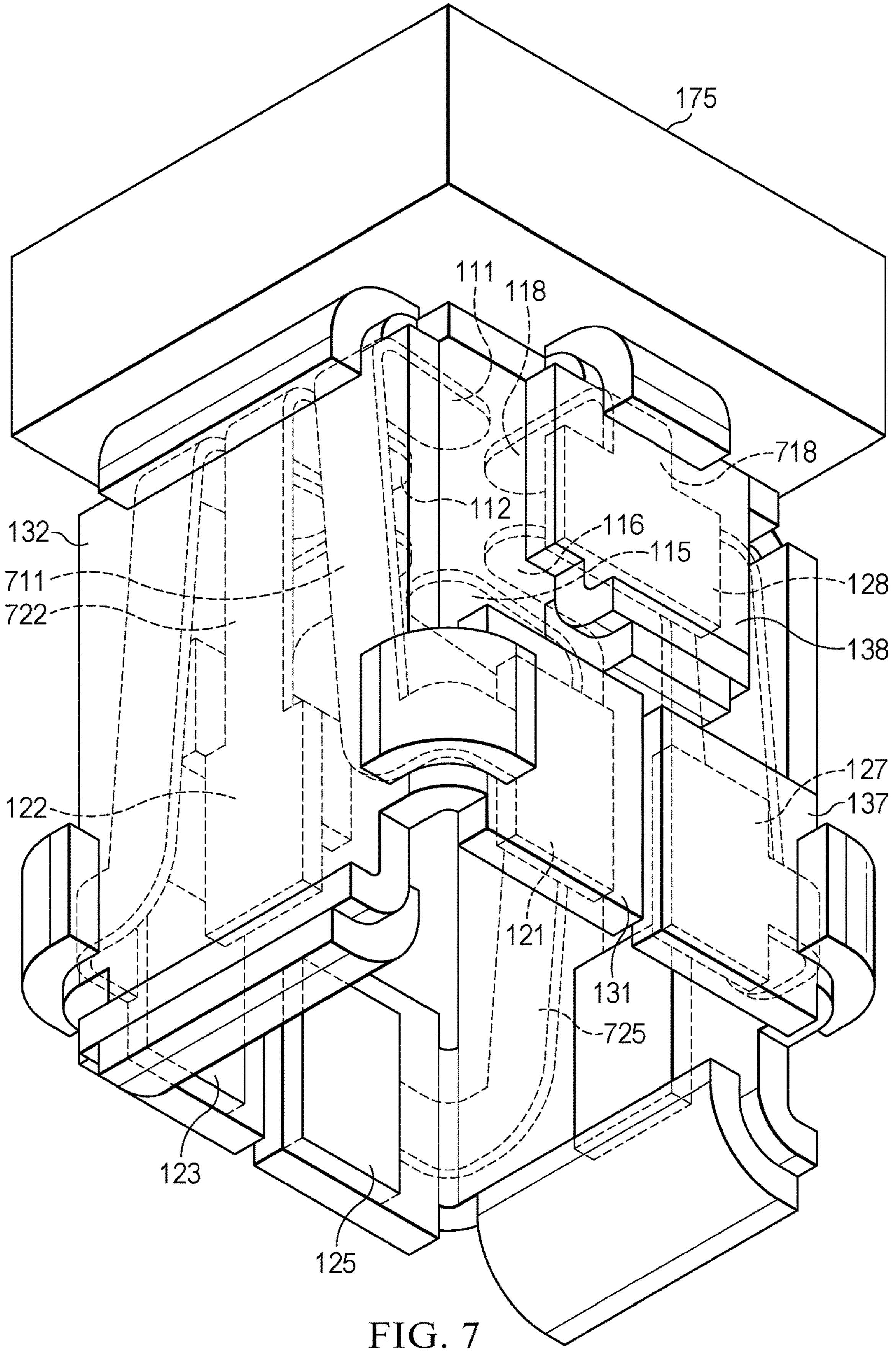
FIG. 7 illustrates an individual die receiving portion of the substrate folded into the second shape.

FIG. 7 illustrates an individual die receiving portion 102 of the substrate folded into the second shape with a die 175 attached thereto. The dashed lines in FIG. 7 are some of the pads that are part of the conductive layer 107, which are hidden from view by their respective peripheral portions which have been folded as described above. Also illustrated in FIG. 7 are some of the conductive connective portions of the conductive layer 107 that couple the pads to their respective contacts, to which the pins of the die 175 are coupled. For example, pad 122 is coupled to contact 112 by connective portion 722. Pad 121 is coupled to contact 111 by connective portion 711. Pad 125 is coupled to contact 115 by connective portion 725. Pad 128 is coupled to contact 118 by connective portion 718. The conductive layer 107 and thus the connective portions of the conductive layer are flexible enough to be bent as shown without breaking. In flex circuit designs, copper has been demonstrated to survive multiple flexures without cracking. For thicker copper structures a cold rolled copper may be used for prolonged flexure endurance.

Figure 8:
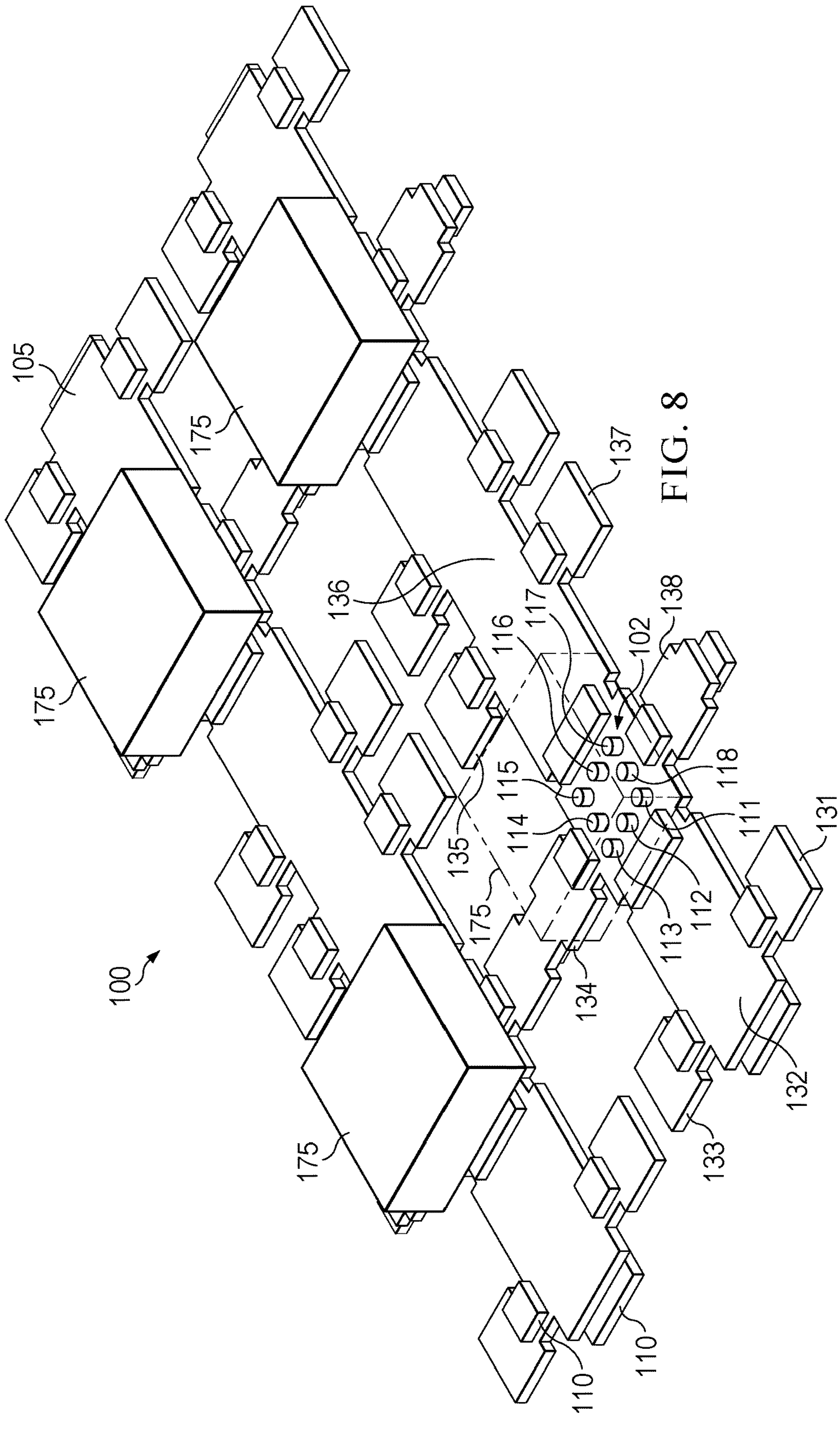
FIG. 8 illustrates an example of the substrate having the shape memory polymer unfolded back into the first shape with individual semiconductor dies attached thereto.

After wafer bonding the folded substrate 100 to the wafer 170, the wafer 170 is singulated to separate the individual dies from each other. The substrate 100 is then expanded back to its permanent shape through application of, for example, heat above the glass transition temperature threshold of the shape memory polymer 110. FIG. 8 shows an example of the substrate 100 back in its initial permanent shape with individual dies 175 attached to their respective die receiving portions 102.

Figure 9:
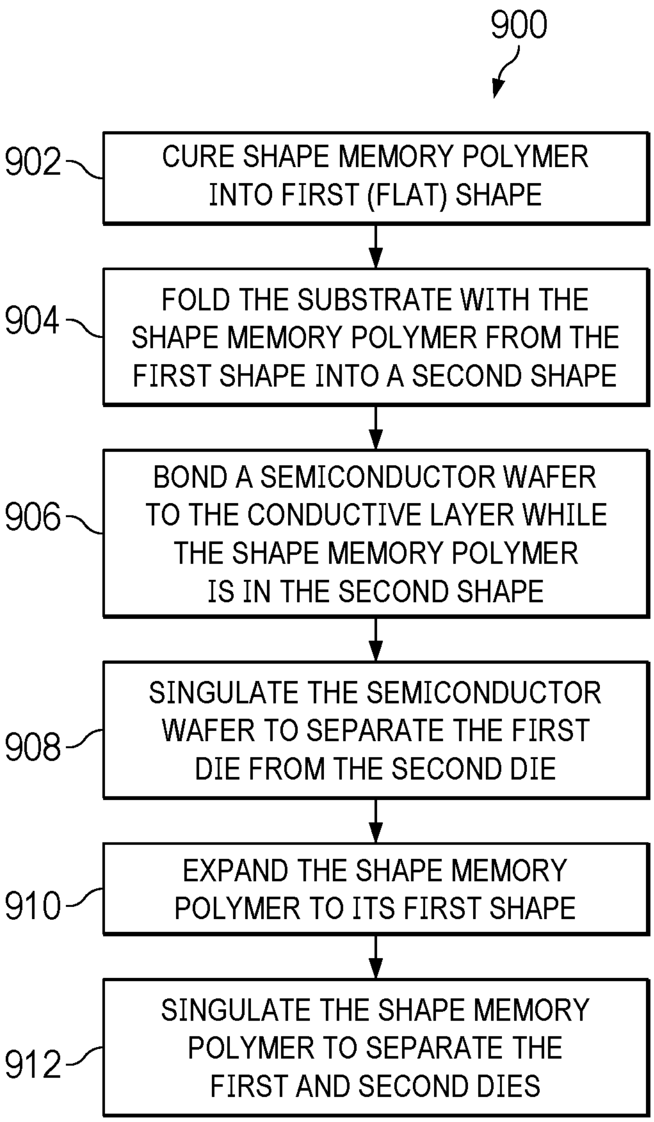
FIG. 9 is an example method for fabricating the device described herein.

FIG. 9 is an example of a process 900 to attach the wafer 170 to the substrate and singulate the resulting structure into individual devices. FIGS. 10-14 illustrate various stages of the structure during the process flow depicted in FIG. 9. Step 902 in process 900 includes curing a shape memory polymer into a first (e.g., flat) shape, such as that shown in FIGS. 1 and 2. This step may be performed by, for example, mechanically forcing the substrate containing the shape memory polymer into a flat shape and then applying an ionizing radiation such as is used for food and medical device sterilization. The time and/or dose can be varied to impart the desired level of cross-linking which also affects the modulus of the material.

Figure 10:
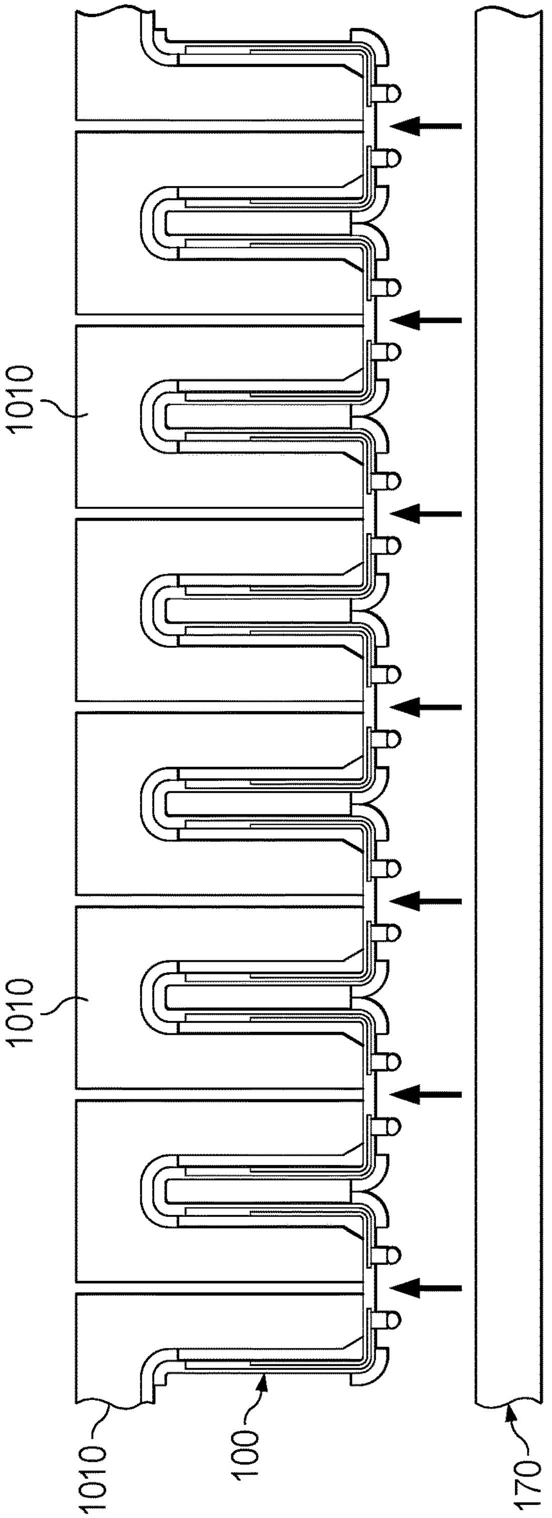
FIGS. 10-14 show the substrate and wafer at various stages of the fabrication process.

At step 904 and illustrated in the example of FIG. 10, the substrate with the shape memory polymer is then folded into a second shape. FIGS. 3-7 provide examples of a folded substrate. FIG. 10 illustrates an example of performing step 904 in which a heated vacuum mandrel 1010 is used. The vacuum mandrel has a shape that is the inverse shape of the desired folded substrate. The vacuum pressure restrains the substrate in the folded state within the mandrel. This tooling constrains the substrate when the wafer bonding temperature is above the glass transition (Tg) temperature of the Shape Memory Polymer) FIG. 10 also shows the wafer 170 before it is bonded to the substrate 100.

Figure 11:
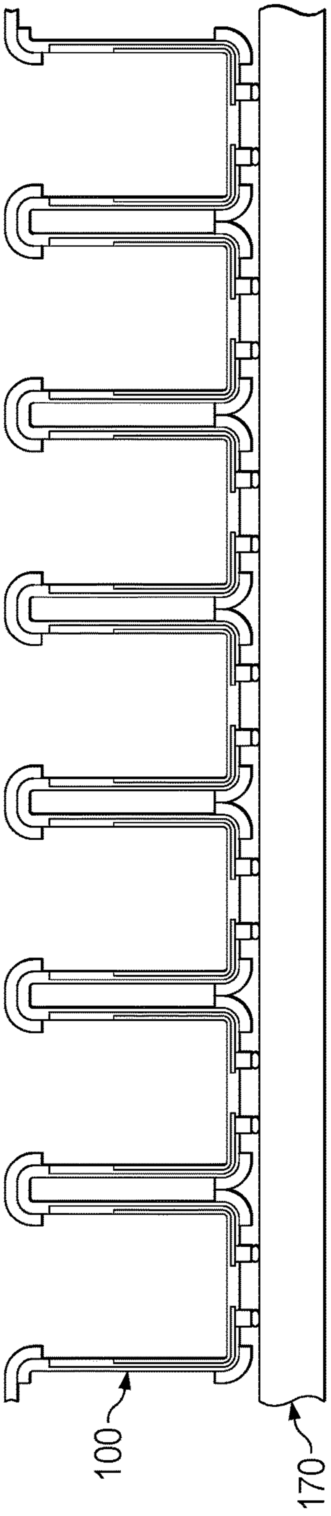
Figure 12:
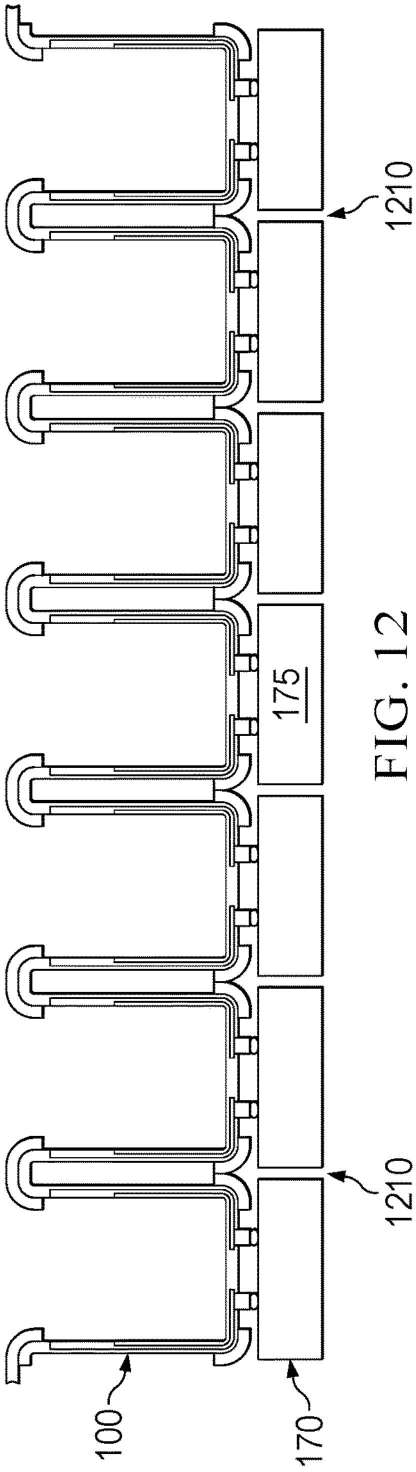

At step 906, the semiconductor wafer 170 is bonded to the conductive layer 107 of the folded substrate 100 within the vacuum mandrel. The vacuum mandrel 1010 can then be removed as illustrated in FIG. 11. At step 908, the wafer 170 is singulated as is indicated by cut lines 1210 in FIG. 12. The cut lines 1210 are between adjacent dies on the wafer. In one example, a laser is used to cut the wafer 170.

Figure 13:
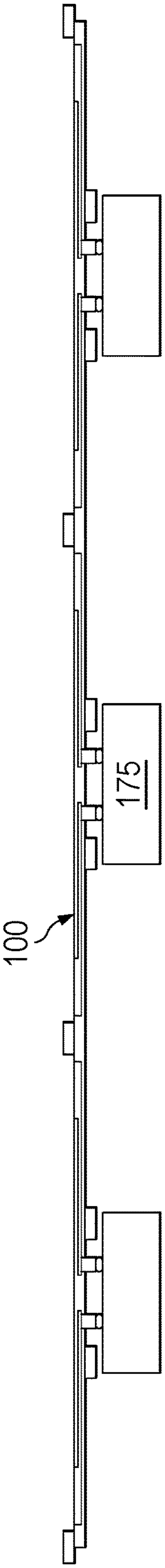

At step 910, the method includes expanding (e.g., unfolding) the substrate with the shape memory polymer back into its first state (flat). This step may be performed as explained above (e.g., application of heat in excess of the glass transition temperature of the shape memory polymer). FIG. 13 illustrates the substrate 100 in its flat state. As a result of expanding the substrate, the dies 175 are spaced farther apart in FIG. 13 than was the case in FIG. 12.

Figure 14:
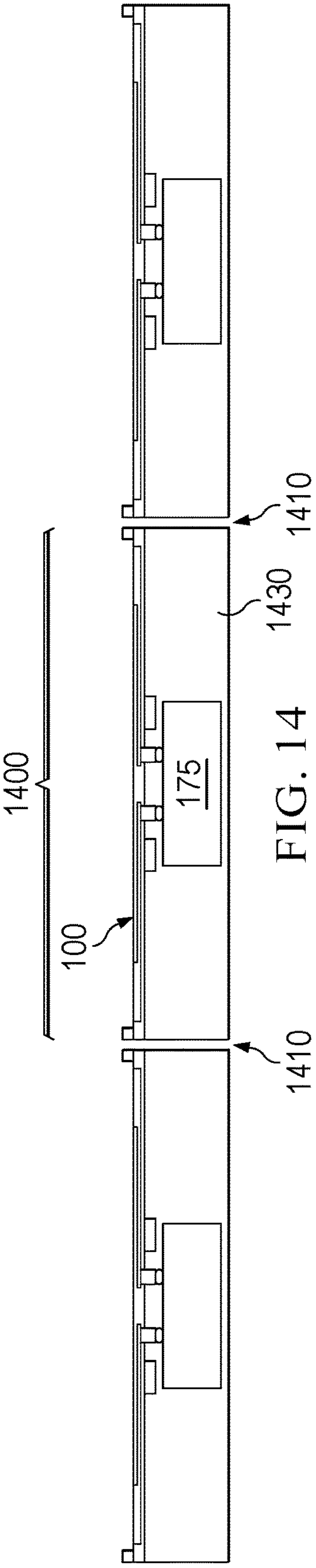

At step 912, the substrate is singulated along cut lines 1410 (FIG. 14) to separate the individual devices 1500 from each other. Each device 1550 includes a die 175 bonded to a portion of the substrate 100. Mold compound 1430 may then be applied to encapsulate the device 1400. In another example, mold compound can be applied across the wafer 170 after the substrate 100 is expanded (FIG. 12) but before the substrate is singulated (FIG. 14).

Instead of including a separate shape memory polymer layer, in an alternate embodiment, the shape memory polymer properties can be incorporated within the polyimide 105 and conductive layer 107. Some areas of the polyimide can be removed to expose contact pads 121-128 of the conductive layer 107 which may eventually be soldered to, for example, a PCB. Two examples of a thermoset polyimide, shape memory polymer are ODA-ODPA (4,4'-diaminodiphenyl (ODA)-oxydiphthalic anhydride (ODPA)) and ODA-BPDA (4,4'-diaminodiphenyl (ODA)-biphenyltetracarboxylic dianhydride (BPDA)). These materials have suitable shape memory properties. For example, these materials have shape recovery greater than 90% from a deformed state once allowed to heat through the glass transition (Tg) temperature.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Modifications are possible in the described embodiments, and other embodiments are possible, within the scope of the claims.

What is claimed is:

1. An integrated circuit, comprising:

a substrate including a first substrate portion, a second substrate portion, and a third substrate portion;

a first shape memory polymer portion coupled between the first and second substrate portions, wherein the first shape memory polymer portion is foldable to position the first and second substrate portions on different planes that are not parallel to each other; and a second shape memory polymer portion coupled between the first and third substrate portions, wherein the second shape memory polymer portion is foldable to position the first and third substrate portions on different planes that are not parallel to each other, wherein the first substrate portion includes one or more contact pads formed thereon.

2. The integrated circuit of claim 1, wherein the first and second shape memory polymer portions comprise at least one of: polyethylene terephthalate (PET), polyurethanes, polyimides, polybenzoxazoles (PBO), polytetrafluoroethylene (PFTE), polylactide (PLA), or ethylene-vinyl acetate (EVA).

3. The integrated circuit of claim 1, wherein the first and second shape memory polymer portions have a flat original shape.

4. The integrated circuit of claim 1, further comprising a semiconductor die coupled to the one or more contact pads.

5. The integrated circuit of claim 4, wherein the first substrate portion includes a layer of polyimide and a conductive layer, the conductive layer being partially covered by the layer of the polyimide, and the one or more contact pads are at exposed portions of the conductive layer.

6. The integrated circuit of claim 5, wherein the conductive layer is covered by the first and second polymer portions.

7. The integrated circuit of claim 6, wherein the conductive layer includes copper.

8. The integrated circuit of claim 6, wherein the layer of the polyimide includes at least one of: a thermoplastic material, or a thermosetting material.

9. The integrated circuit of claim 1, wherein the substrate includes at least one of: diaminodiphenyl (ODA)-oxydiphthalic anhydride (ODPA), or diaminodiphenyl (ODA)-biphenyltetracarboxylic dianhydride (BPDA).

10. The integrated circuit of claim 1, further comprising a mold compound on the substrate and encapsulating the semiconductor die.

11. The integrated circuit of claim 1, wherein the first shape memory polymer portion at least partially covers the first and second substrate portions.

12. The integrated circuit of claim 1, wherein the first shape memory polymer portion is foldable to position the second substrate portion perpendicular to the first substrate portion.

13. The integrated circuit of claim 1, further comprising:

a fourth substrate portion including a contact pad; and a third shape memory polymer portion coupling the fourth substrate portion to the first substrate portion.

14. An integrated circuit, comprising:

a substrate including a first substrate portion, a second substrate portion, and a third substrate portion;

a first polymer portion that is capable of changing between a first shape and a second shape upon being heated, wherein the first polymer portion is non-conductive and is coupled between the first and second substrate portions; and a second polymer portion capable of changing between the first shape and the second shape upon being heated, wherein the second polymer portion is non-conductive and is coupled between the first and third substrate portions, wherein the first substrate portion includes one or more contact pads formed thereon.

15. The integrated circuit of claim 14, wherein:

the first shape is a flat shape, and the second shape is a bent shape; or the first shape is the bent shape, and the second shape is the flat shape.

16. The integrated circuit of claim 14, wherein the first and second polymer portions include a shape memory polymer.

17. The integrated circuit of claim 14, wherein the first shape is an original shape of the first and second polymer portions, and the first and second polymer portions are configurable to change from the second shape to the original shape responsive to at least one of: a temperature change, an electric field, or a magnetic field.

18. The integrated circuit of claim 14, further comprising:

a semiconductor die coupled to the one or more contact pads on the first substrate portion; and a mold compound on the substrate and encapsulating the semiconductor die.

19. A method of fabricating an integrated circuit, the method comprising:

changing a substrate including a shape memory polymer from a first shape to a bent shape;

mounting a semiconductor wafer on the substrate having the bent shape; and singulating the semiconductor wafer mounted on the substrate into semiconductor dies.

20. The method of claim 19, further comprising at least one of:

changing the substrate having the semiconductor dies mounted thereon from the bent shape to the first shape;

singulating the substrate having the first shape into multiple substrates each having one or more semiconductor dies mounted thereon; or applying a mold compound on the one or more semiconductor dies.

* * * * *